US006534336B1

(12) United States Patent
Iwane et al.

(10) Patent No.: US 6,534,336 B1
(45) Date of Patent: Mar. 18, 2003

(54) PRODUCTION METHOD OF PHOTOELECTRIC CONVERSION DEVICE, AND PHOTOELECTRIC CONVERSION DEVICE PRODUCED BY THE METHOD

(75) Inventors: Masaaki Iwane, Atsugi (JP); Takao Yonehara, Atsugi (JP); Shoji Nishida, Hiratsuka (JP); Kiyofumi Sakaguchi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/572,940

(22) Filed: May 18, 2000

(30) Foreign Application Priority Data

May 21, 1999 (JP) .......................... 11-140895

(51) Int. Cl.[7] .............................................. H01L 21/00
(52) U.S. Cl. ........................................ 438/71; 438/29
(58) Field of Search ................................ 438/29, 71

(56) References Cited

U.S. PATENT DOCUMENTS

| 5,008,206 A | | 4/1991 | Shinohara et al. ............ 437/3 |
| 5,248,621 A | | 9/1993 | Sano ........................... 437/3 |
| 5,486,238 A | * | 1/1996 | Nakagawa et al. |
| 5,811,348 A | | 9/1998 | Matsushita et al. .......... 438/455 |
| 5,891,264 A | * | 4/1999 | Shinohara et al. |
| 6,127,623 A | * | 10/2000 | Nakamura et al. |

FOREIGN PATENT DOCUMENTS

| JP | 4355970 | 12/1992 |
| JP | 8124894 | 5/1996 |
| JP | 8213645 | 8/1996 |

* cited by examiner

Primary Examiner—Long Pham
(74) Attorney, Agent, or Firm—Fitzpatrick, Cella, Harper & Scinto

(57) ABSTRACT

The present invention provides a production method of a photoelectric conversion device, which comprises a step of forming an uneven shape on a surface of a substrate, a step of providing a separation layer maintaining the uneven shape on the substrate, a step of forming a semiconductor film maintaining the uneven shape on the separation layer, and a step of separating the semiconductor film from the substrate at the separation layer, wherein the step of forming the uneven shape on the surface of the substrate is a step of forming the substrate having the uneven shape on the surface by anisotropic etching of the substrate with the separation layer remaining after the separation. The present invention also provides a photoelectric conversion device produced by the above method.

4 Claims, 19 Drawing Sheets

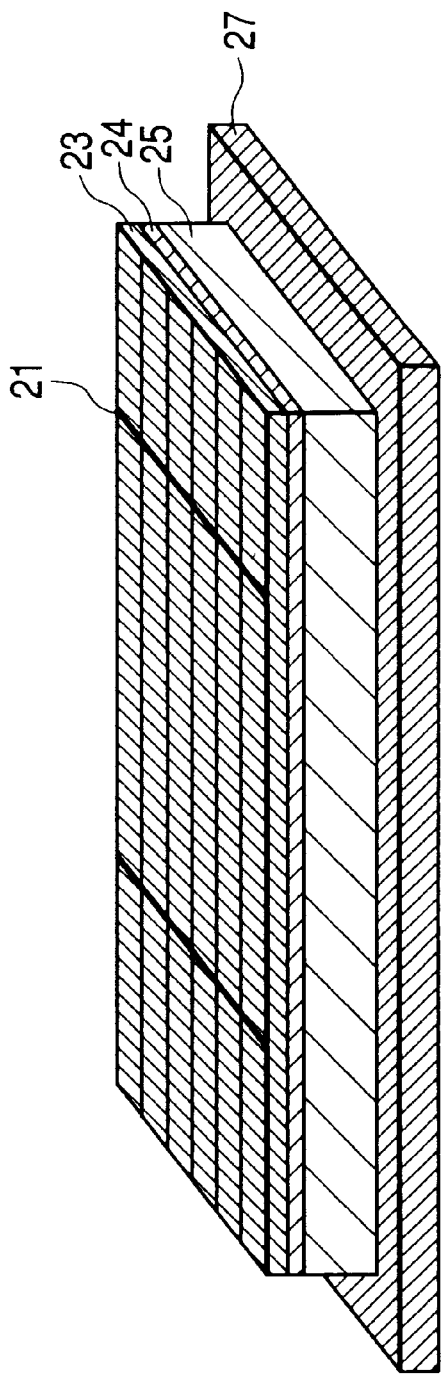 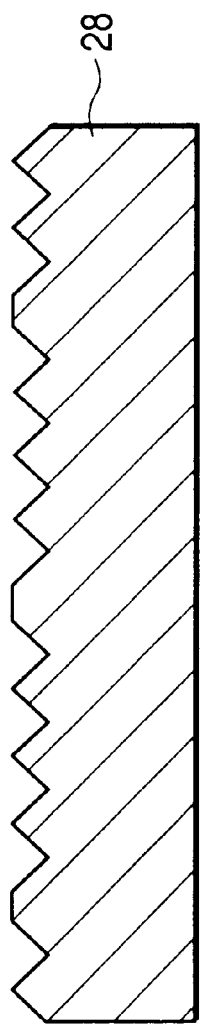
FIG. 5A
FIG. 5B

PRODUCTION METHOD OF PHOTOELECTRIC CONVERSION DEVICE, AND PHOTOELECTRIC CONVERSION DEVICE PRODUCED BY THE METHOD

BACKGROUND OF THE INVENTION

1. Field of the Invention

The present invention relates to photoelectric conversion devices such as solar cells, photosensors, and so on, and a production method of such devices and, particularly to photoelectric conversion devices, such as the solar cells, photosensors, etc., comprising a semiconductor layer with an uneven structure (concave-convex structure) which functions as a photoelectric conversion layer, and a production method thereof.

2. Related Background Art

The global environment has been being deteriorated by emissions of carbon dioxide, nitrogen oxides, etc., which are earth-warming gases, due to combustion of petroleum for thermal power generation, combustion of gasoline in automobile engines, and so on. There is also worry about future exhaustion of crude oil and thus attention is now focusing on photovoltaic power generation.

Thin-film crystal silicon (Si) solar cells can be made inexpensively because their power generation layers are thin and an use amount of Si raw material is small. Since crystal Si is used for the power generation layer, it can be expected to implement higher conversion efficiency and less deterioration than the solar cells of amorphous Si and the like. Further, because the thin-film crystal Si solar cells can be bent to some extent, they can be used with being glued on curved portions such as bodies of automobiles, household electrical appliances, roof tiles, and so on.

For realizing the thin-film crystal Si solar cells, Japanese Patent Application Laid-Open No. 8-213645 discloses separation of a thin-film single-crystal Si layer by making use of epitaxial layers on a porous Si layer. FIG. 19 is a cross-sectional view showing a method for formation of a thin-film crystal Si solar cell, which is disclosed in Japanese Patent Application Laid-Open No. 8-213645. In FIG. 19, reference numeral 101 designates a non-porous Si substrate, 102 a porous Si layer, 103 a p$^+$ Si layer, 104 a p$^-$ Si layer, 105 an n$^+$ Si layer, 106 a protective film, 109 and 111 an adhesive, and 110 and 112 a jig. In the solar cell production method of FIG. 19, the structure having the porous Si layer 102 in the surface region of the non-porous Si substrate 101 can be formed by anodization of an Si wafer. After that, the p$^+$ Si layer 103 is epitaxially grown on the porous Si layer 102, and the p$^-$ Si layer 104 and n$^+$ Si layer 105 are further grown thereon. Then the protective layer 106 is formed thereon. Then the protective layer 106 and non-porous Si substrate 101 are provided with the adhesive 111 and 109, respectively, and are bonded to the jig 112 and 110, respectively. After that, tensile force is exerted on the jig 112 and 110 to separate the non-porous Si substrate 101 from the epitaxial Si layers 103, 104 and 105 at the porous Si layer 102. Then the solar cell is formed using the epitaxial Si layers 103, 104 and 105, and the non-porous Si substrate 101 is put again into the same steps as described above, thereby decreasing the cost.

For increasing the photoelectric conversion efficiency, there are corrugated solar cells in which the front and back surfaces of the semiconductor layers are provided with an uneven shape (concave-convex shape). FIG. 20 is a perspective view of a semiconductor substrate of a solar cell disclosed by Uematsu et al. ("High-efficiency solar cells" workshop, Sapporo (1989), A6, p31). The corrugated solar cells can demonstrate a high photoelectric conversion efficiency even with the semiconductor layers of thin films, because optical path lengths of incident light are long. The corrugated substrate of Uematsu et al. is produced by a method of carrying out anisotropic etching with etching masks on the both surfaces of Si wafer. As a result, the corrugated substrate is obtained in the substrate thickness (the wafer thickness) of about several ten $\mu$m.

Further, Japanese Patent Application Laid-Open No. 4-355970 discloses that the solar cell having the uneven shape on the surface is formed by use of single-crystal Si layers in such a way that the (100) Si wafer is subjected to anisotropic etching to form V-shaped grooves, an oxide film is selectively formed on the surface thereof, the single-crystal Si layers are formed on the surface thereof, and the single-crystal Si layers are separated from the Si wafer.

The corrugated substrate production method of Uematsu, et al. illustrated in FIG. 20 necessitates the formation of the etching masks on the both surfaces of the semiconductor substrate and thus has to repeatedly use the high-cost steps of photolithography, etc. In addition, a large amount of Si is removed by etching, and this point is also the cause of high cost. Therefore, the solar cells and photosensors produced by use of this corrugated substrate suffer the drawback of high production cost, though demonstrating the high photoelectric conversion efficiency.

SUMMARY OF THE INVENTION

An object of the present invention is, therefore, to provide a production method of photoelectric conversion device that necessitates a smaller number of use times of the high-cost steps of photolithography and the like, that can reduce consumption of Si, and that permits reclaiming of the substrate. Another object of the present invention is to provide a photoelectric conversion device that can be provided at low production cost.

The present invention provides a production method of a photoelectric conversion device, the production method comprising a step of forming an uneven shape (concave-convex shape) in a surface of a substrate, a step of providing a separation layer maintaining the uneven shape on the substrate, a step of forming a semiconductor film maintaining the uneven shape on the separation layer, and a step of separating the semiconductor film from the substrate at the separation layer, wherein the step of forming the uneven shape in the surface of the substrate is a step of forming the substrate having the uneven shape on the surface by anisotropic etching of the substrate with the separation layer remaining after the separation.

In the above method, it is preferable that the step of providing the separation layer be a step of forming a porous semiconductor layer as the separation layer on a semiconductor substrate by anodization of the semiconductor substrate.

The substrate having the uneven shape on the surface or a substrate having an even surface can be used as the substrate with the separation layer remaining after the separation.

It is also preferable that the step of forming the uneven shape on the surface of the substrate be a step of forming regions non-parallel to the principal plane of the substrate and regions parallel to the principal plane of the substrate in the surface of the substrate. For implementing this, it is preferable that anisotropic etching be carried out by using masks provided on portions of the substrate, whereby the portions covered with the masks on the surface of the substrate are formed as the regions parallel to the principal plane of the substrate.

Further, the present invention provides photoelectric conversion devices produced by the above methods; i.e., the photoelectric conversion device comprising a semiconductor film having the uneven shape in a light incident surface and a surface opposite thereto, and a back reflecting layer provided on the surface side opposite to the light incident surface of the semiconductor film; the photoelectric conversion device comprising a semiconductor film having a substantially even light incident surface and the uneven shape in a surface opposite thereto, and a back reflecting layer provided on the surface side opposite to the light incident surface of the semiconductor film; and the photoelectric conversion device wherein an electrode is formed on each of portions formed on the regions of the semiconductor film parallel to the principal plane of the substrate.

BRIEF DESCRIPTION OF THE DRAWINGS

FIG. 5A is a perspective view of a solar cell and FIG. 5B is a cross-sectional view of a Si wafer;

DETAILED DESCRIPTION OF THE PREFERRED EMBODIMENTS

Figure 1A:
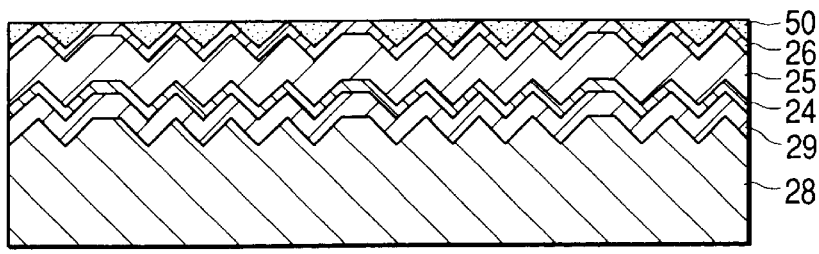
FIGS. 1A, 1B, 1C, 1D and 1E are cross-sectional views for illustrating production steps of the solar cell of Embodiment 1.

An example of the production method of photoelectric conversion device according to the present invention is a method for producing a photoelectric conversion device, the method comprising a step of preliminarily forming an uneven shape in a substrate, a step of providing a separation layer maintaining the uneven shape of the substrate thereon, a step of growing a semiconductor thin film maintaining the uneven shape on the separation layer, and a step of separating the semiconductor thin film from the substrate at the separation layer, wherein the substrate with the separation layer remaining thereon after the separation is subjected to anisotropic etching in order to form the uneven shape in the substrate.

Since this production method comprises the step of preliminarily forming the uneven shape in the substrate, the step of providing the separation layer maintaining the uneven shape of the substrate thereon, the step of growing the semiconductor thin film maintaining the uneven shape on the separation layer, and the step of separating the semiconductor thin film from the substrate at the separation layer, the method can permit the semiconductor thin films having the uneven shape to be provided in quantity without lithography once the uneven shape is formed in one substrate.

Since the substrate with the separation layer remaining after the separation is subjected to the anisotropic etching in order to form the uneven shape in the substrate, the uneven shape can be formed at the same time of reclaim (removal of the separation layer) for reuse by using the substrate having passed once through the production steps. This results in simplifying the steps and thus permits reduction of the production cost of the photoelectric conversion device.

In a preferred embodiment, the substrate is a semiconductor substrate and a porous semiconductor layer is formed as the separation layer on the semiconductor substrate by anodization of the semiconductor substrate. According to this method, the photoelectric conversion device of the uneven shape with good optical absorption can be provided by the simple steps.

Here the substrate includes the ordinary semiconductor wafers such as Si wafers, GaAs wafers, and so on, and the semiconductor wafers may be of a single crystal or polycrystals. Further, the substrate also includes metallurgical grade Si substrates, ceramic substrates, and metal substrates such as SUS (stainless steel) substrates and the like.

The uneven shape of the substrate used in the initial growth of a semiconductor thin film can be formed by anisotropic etching with an etching liquid or by anisotropic etching in combination with photolithography. It may also be formed by a laser or by mechanical grinding.

The uneven shape of the substrate with the separation layer remaining after the separation is formed by anisotropic etching at the same time of the removal of the separation layer. The substrate with the separation layer remaining after the separation can be used from the initial growth of a semiconductor thin film or from the second or later growth of the semiconductor thin film. The substrate with the separation layer remaining after the separation can be made of one having the uneven shape from the beginning or one having an even shape. In use of the substrate having the uneven shape from the beginning, there are also cases where a new uneven shape is formed by further sharpening the original uneven shape. In use of the substrate having the even shape, a new uneven shape is formed therein.

The semiconductor thin film can be of a single crystal or polycrystals and the ordinary semiconductors such as Si, GaAs, Ge, and so on can be used as materials for the semiconductor thin film.

The uneven shape (concave-convex shape) of the semiconductor thin film can be the corrugated structure, and the semiconductor thin film includes those having uneven shaped front and back surfaces with many pyramid, inverse pyramid, or spherical shapes. When the uneven shape is the corrugated, pyramid, inverse pyramid, or spherical shape, the pitch thereof is desirably about 0.1 μm to about 100 μm.

The separation layer may be a porous semiconductor layer or a layer of different component elements or different mixed crystal ratios. For example, it can be a porous Si layer or an AlGaAs layer.

The semiconductor thin film maintaining the uneven shape, stated in the present invention, means a semiconductor thin film grown on the substrate having the uneven shape, and it also includes a semiconductor thin film whose uneven shape became naturally blunted in order to lower a surface energy.

The present invention also embraces the photoelectric conversion device itself.

Namely, a photoelectric conversion device of the present invention is the photoelectric conversion device produced by the above production method, which comprises a photoelectric conversion layer composed of a semiconductor thin film having an uneven-shaped front and back surfaces, and a back reflecting layer on the back surface of the photoelectric conversion layer. This photoelectric conversion device can be provided as a photoelectric conversion device with good optical absorption at a low production cost.

Another photoelectric conversion device of the present invention is the photoelectric conversion device produced by the above production method, which comprises a photoelectric conversion layer composed of a semiconductor thin film having an uneven-shaped back surface thereof and a substantially even-shaped front surface, and a back reflecting layer on the back surface of the photoelectric conversion layer. In this photoelectric conversion device, because the front surface is of the substantially even shape, formation of a grid pattern is easy and it is also easy to form an antireflection film on the front surface. For this reason, the photoelectric conversion device with good optical absorption can be provided at a low production cost.

The present invention will be described further with Embodiments 1 to 7 thereof.

Embodiment 1 is an embodiment in which the solar cell is produced by forming a porous Si layer as the separation layer, growing three single-crystal Si layers as the semiconductor thin film, and defining a separation surface as a light incident surface and in which after the production of the solar cell the separated substrate is reclaimed by anisotropic etching. Embodiment 2 is an embodiment in which the separated substrate reclaimed by an anisotropic etching liquid is used from the initial growth of a semiconductor thin film. Embodiment 3 is an embodiment in which the solar cell is produced by forming the porous Si layer as the separation layer, growing two single-crystal Si layers thereon, and defining the separation surface as a light incident layer. Embodiment 4 is an embodiment in which the solar cell is produced by forming the porous Si layer as the separation layer, growing two layers of semiconductor thin films thereon, and defining the separation surface as a back surface. Embodiment 5 is an embodiment in which the solar cell is produced by forming the porous Si layer as the separation layer, growing two single-crystal Si layers thereon, and separating them from the substrate by use of through holes bored in the single-crystal Si layers. Embodiment 6 is an embodiment in which the solar cell is produced by making the separation layer of a compound semiconductor of different mixed crystal ratios, growing three single-crystal compound semiconductor layers as the semiconductor thin film, and defining the separation surface as a light incident surface. Embodiment 7 is an embodiment of production of a photosensor.

In addition to the embodiments described below, the present invention also involves all combinations of the steps in the embodiments described below, and those defined in the claims and equivalents thereto, though not stated explicitly in the following embodiments.

(Embodiment 1)

Embodiment 1 is the embodiment in which the solar cell is produced by forming the porous Si layer as the separation layer, growing three single-crystal Si layers as the semiconductor thin film, and defining the separation surface as a light incident surface and in which thereafter the separated substrate is reclaimed by anisotropic etching. FIGS. 1A to 1E and FIGS. 2A to 2E are the cross-sectional views for illustrating the production steps of the solar cell of Embodiment 1.

Figure 2A:
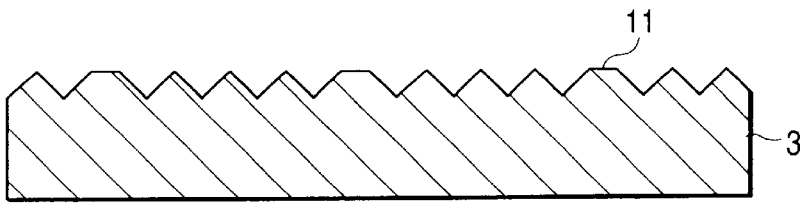
FIGS. 2A, 2B, 2C, 2D and 2E are cross-sectional views for illustrating production steps of the solar cell of Embodiment 1.

First, as illustrated in the cross-sectional view of FIG. 2A, the uneven shape is formed on the surface of a non-porous Si substrate 28, which is the substrate of the present invention. Smooth portions 11 in the uneven shape are portions on which the grid electrode is placed after subsequent growth of the semiconductor thin film. Provision of such smooth portions (preferably, portions parallel to the principal plane of the substrate: the principal plane is a plane parallel to a horizontal plane when the substrate is placed on the horizontal plane) in the formation of the uneven shape contributes to remarkably decreasing the possibility of breaking of the grid electrodes.

Figure 3:
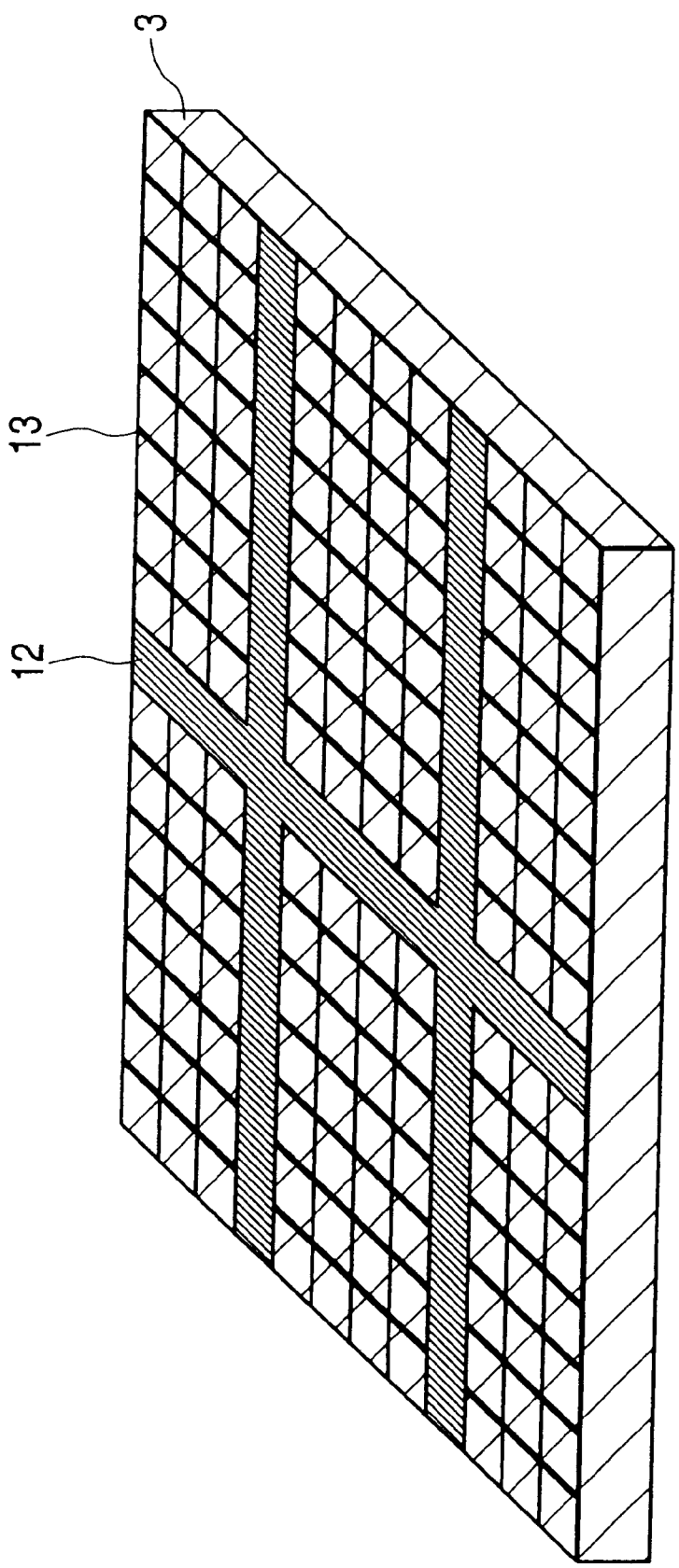
FIG. 3 is a perspective view of an etching mask on the Si wafer in Embodiment 1.

FIG. 3 is the perspective view for showing a state in which an Si wafer 3 is covered with an etching mask having portions 12 and 13 formed by the method of photolithography or the like for the formation of the uneven shape. For forming the etching mask having portions 12 and 13, for example, an oxide film or a nitride film is formed on the surface of the Si wafer 3, for example, by a method of atmospheric pressure CVD or the like. Next, a resist is applied onto the surface of the oxide film or the nitride film thus formed and is then patterned by photolithography. Then the oxide film or the nitride film except for the etching mask having portions 12 and 13 is removed by wet etching with an HF (hydrofluoric acid)-based etching liquid, by dry etching with $CF_4$ or $SF_6$ or the like, or by another method, to obtain the etching mask having portions 12 and 13. The etching mask having portions 12 and 13 has wide lines 12 and narrow lines 13, the wide lines 12 corresponding to the smooth portions 11 of the uneven shape.

After the etching mask having portions 12 and 13 is created on the Si wafer 3 as illustrated in FIG. 3, this Si wafer 3 is subjected to etching with a liquid to induce the anisotropic etching, such as KOH, hydrazine, or the like. This results in obtaining the Si wafer 3 having the uneven shape with the smooth portions 11 as illustrated in the cross-sectional view of FIG. 2A. An example of the substrate used herein is one having the principal plane of (100) plane and by the anisotropic etching of such a substrate, for example, the (111) plane can be exposed in the surface. A method employed as the anisotropic etching method can be the method described in J, knobloch, et al., 23rd IEEE PVSC, Louisville (1993) p.271. In the method of J, knobloch, et al., the surface texture of the inverse pyramid shape is formed with KOH, which is an alkaline etching liquid. Another applicable method is the texture treatment with an acid as described in Japanese Patent Application Laid-Open No. 8-124894. In this case, the texture surface of the spherical shape will result.

FIG. 2A is the cross-sectional view of the unevenly shaped or textured Si wafer 3. When this Si wafer 3 is subjected to anodization, a porous Si layer 29 as the separation layer is formed on the uneven surface of the non-porous Si substrate 28.

Figure 4A:
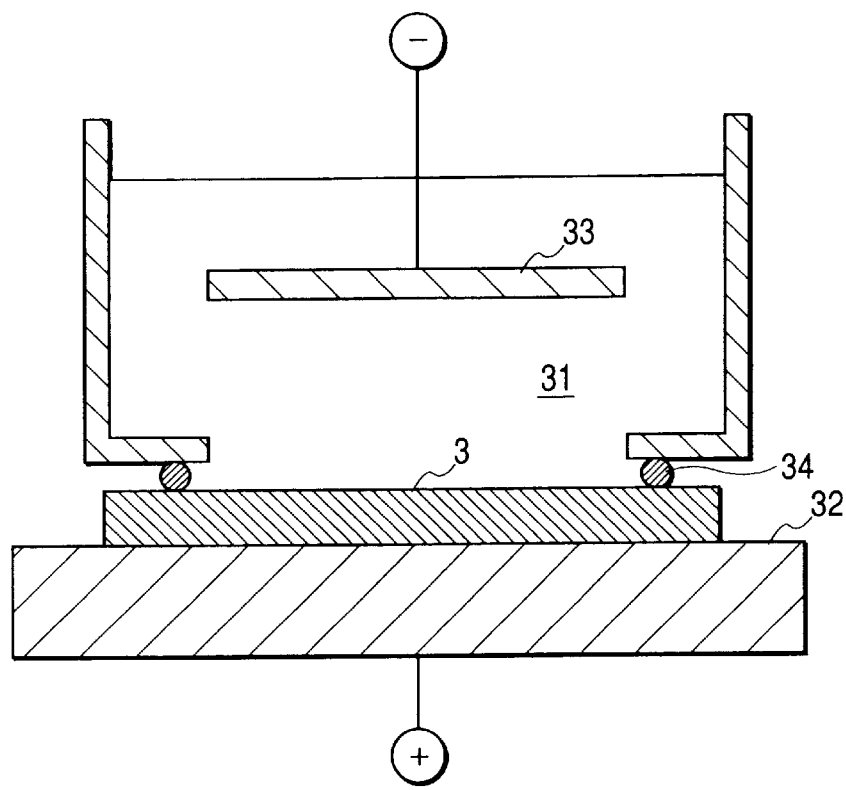
FIGS. 4A and 4B are cross-sectional views of anodization apparatus in Embodiment 1.
Figure 4B:
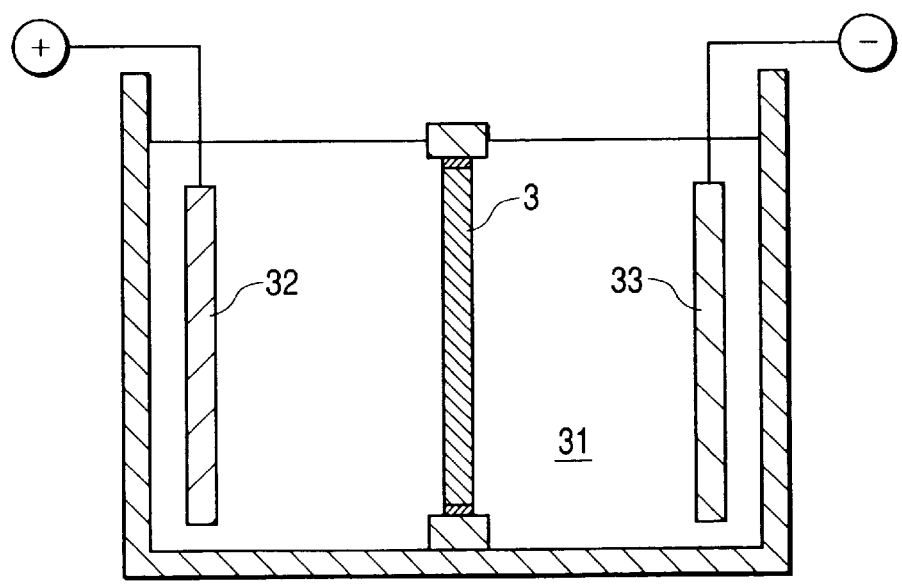

FIGS. 4A and 4B are the cross-sectional views of apparatus for carrying out the anodization of Si wafer with the HF-based etching liquid. In FIGS. 4A and 4B, reference numeral 3 designates the Si wafer, 31 the HF-based etching liquid, 32 and 33 metal electrodes, and 34 an O-ring. The Si wafer 3 to be anodized is desirably of the p-type, but it may also be of the n-type if the resistance is low. In the case of the n-type wafer, it is desirable to perform the formation of the porous layer after the wafer is exposed to light to create holes therein. The porous layer is formed in the upper surface side of the Si wafer 3 when a voltage is placed between the two electrodes with the lower metal electrode 32 being positive and with the upper metal electrode 33 being negative as illustrated in FIG. 4A and when the wafer is placed so that electric flux induced by this voltage is normal to the surface of the Si wafer 3. When the electric field is applied horizontally with the left metal electrode 32 being positive and with the right metal electrode 33 being negative as illustrated in FIG. 4B, the porous layer is formed in the right surface side of the Si wafer 3.

Concentrated hydrofluoric acid (for example, 49% HF) is preferably used as the HF-based etching liquid 31. Since bubbles evolve from the Si wafer 3 during the anodization, alcohol is added as a surfactant in order to remove the bubbles efficiently. The alcohol is desirably one selected from the group consisting of methanol, ethanol, propanol, isopropanol, and so on. An agitator may also be used instead of the surfactant to carry out the anodization while agitating the liquid. The thickness of the porous layer is preferably 1 to 30 µm.

Figure 2B:
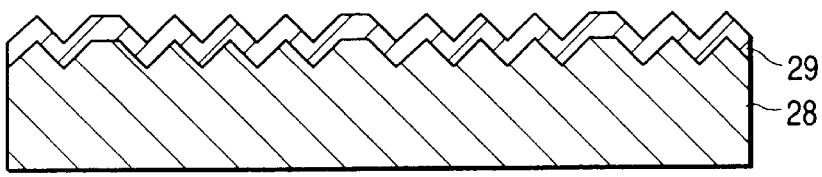

After completion of the anodization of the Si wafer according to the above steps, the porous Si layer 29 is formed on the non-porous Si substrate 28 as illustrated in FIG. 2B.

Figure 2C:
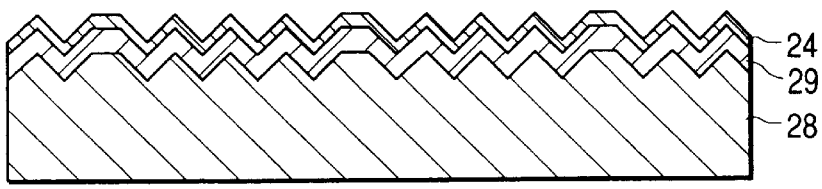
Figure 2D:
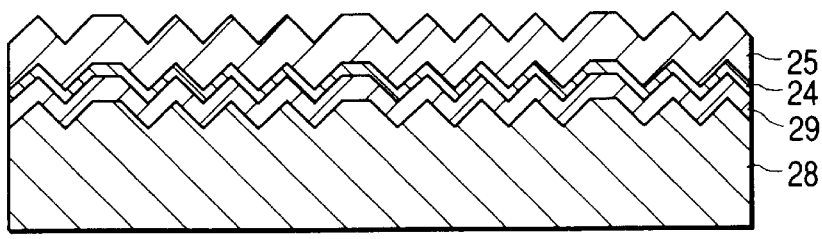
Figure 2E:
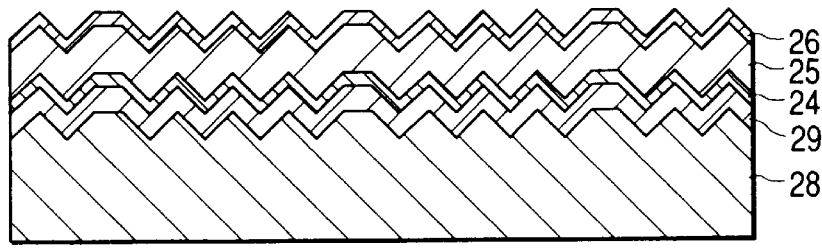

After that, as illustrated in FIG. 2C, a single-crystal n$^+$ Si layer 24 is epitaxially grown by liquid phase epitaxy. Although the porous Si layer 29 is formed in the bored structure, monocrystallinity thereof is maintained. This permits epitaxial growth on the porous Si layer 29. After that, a single-crystal p$^-$ Si layer 25 is also formed by liquid phase epitaxy, as illustrated in FIG. 2D. Next, a single-crystal p$^+$ Si layer 26 is formed by liquid phase epitaxy as illustrated in FIG. 2E. These single-crystal Si layers 24, 25 and 26 compose the semiconductor thin film of the present invention.

Figure 1B:
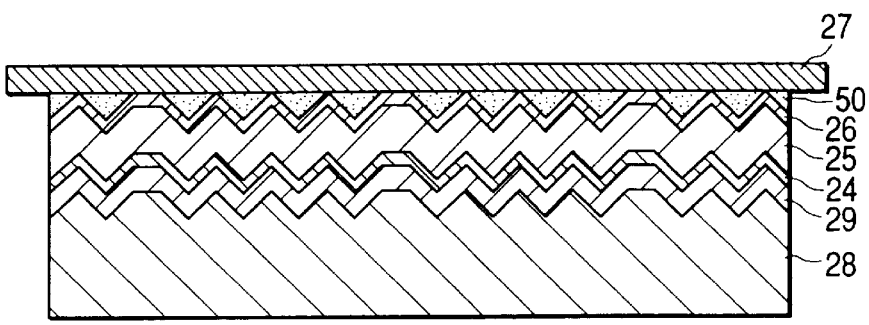
Figure 1C:
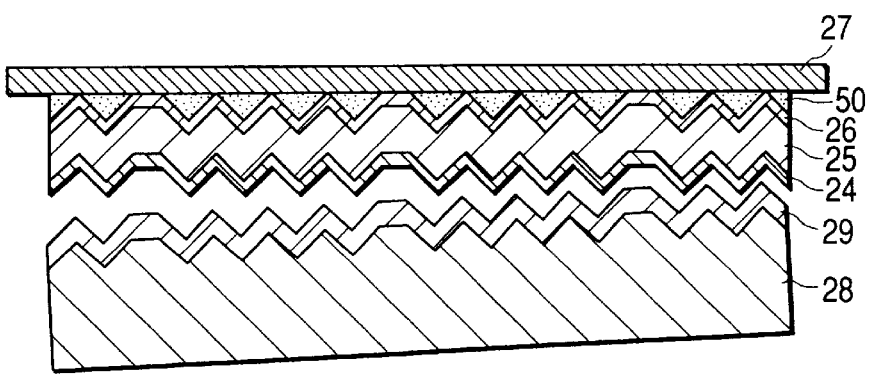

After that, an adhesive 50 is delivered onto the p$^+$ Si layer 26 as illustrated in FIG. 1A, and then an SUS substrate 27 is glued onto the p$^+$ Si layer 26 so that projections of the p$^+$ Si layers 26 are in contact with the SUS substrate 27 functioning as a back electrode, as illustrated in FIG. 1B. In this case, because the back reflecting layer of the present invention is the SUS substrate 27, it is desirable that the SUS substrate 27 be one having high reflectance. The adhesive 50 may be either electrically conductive or insulative as long as it can provide good electrical connection between the SUS substrate 27 and the p$^+$ Si layer 26. The SUS substrate 27 may have the uneven shape preliminarily formed so as to match with the uneven shape of the back surface on the p$^+$ Si layer 26.

Next, the non-porous Si substrate 28 is separated at the porous Si layer 29 from the Si layers 24, 25 and 26 for forming a solar cell. The porous Si layer 29 has more fragile structure than the Si wafer 28 and the epitaxially grown Si portions. Therefore, the non-porous Si substrate 28 can be separated from the single-crystal Si layers 24, 25 and 26 at the porous Si layer 29 by either of a method of exerting tensile force between the SUS substrate 27 and the non-porous Si substrate 28, a method of forcing a wedge into the porous layer 29 from the side, a method of ejecting a water jet like a wedge, and so on.

Figure 1D:
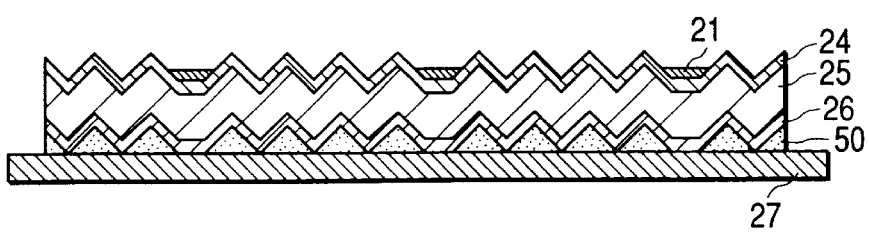
Figure 1E:
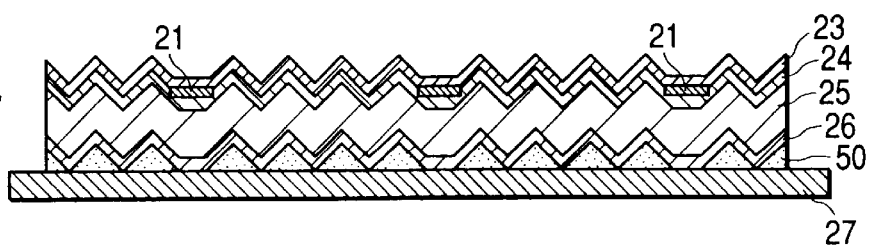

Next, the single-crystal Si layers 24, 25 and 26 etc. are turned upside down as illustrated in FIG. 1D and the grid electrode 21 is formed on the flat portions of the uneven n$^+$ Si layer 24 by a method such as printing or the like. Then an antireflection film of TiO$_2$, ITO or the like is provided on the surface of the grid electrode 21 and the n$^+$ Si layer, thereby completing a solar cell unit. FIG. 5A is a perspective view of the solar cell unit thus completed.

The non-porous Si substrate 28 with the porous Si layer 29 on the surface, which was used in the production of the solar cell of Embodiment 1, is subjected to anisotropic etching with an alkali anisotropic etching liquid such as KOH or the like, to remove the porous Si layer 29, whereby the non-porous Si substrate 28 having the uneven shape in the surface is obtained again as illustrated in the cross-sectional view of FIG. 5B. The reason why the porous Si layer 29 is removed is that the surface of the porous Si layer after the separation is often rough and it is thus not easy to form a satisfactory epitaxial layer thereon.

Next, this non-porous Si substrate 28 is put again as the Si wafer 3 of FIG. 2A into the steps starting from FIG. 2A to produce further single-crystal thin-film solar cells from a single Si wafer.

According to Embodiment 1, a plurality of single-crystal thin-film solar cells can be formed from a single Si wafer. Therefore, the thin-film single-crystal Si solar cells demonstrating high conversion efficiency and less deterioration can be provided at a low watt cost. Since the optical path lengths of the incident light are long because of the uneven shape on the front and back surfaces of the solar cells, the single-crystal layers show good absorption coefficient of light even if the single-crystal layers are formed as thin films.

In Embodiment 1, the substrate 3 was described as the Si wafer, but the substrate may be a compound semiconductor wafer of GaAs or the like. Further, the layers 24, 25 and 26 were described as the single-crystal Si layers, but they may also be layers of a compound semiconductor such as GaAs or the like. Further, the formation of the single-crystal Si layers 24, 25 and 26 was described as the liquid phase growth, but they may also be formed by vapor phase growth such as CVD or the like. It is hard to form a layer of 30 µm or more by vapor phase growth, but the semiconductor layers formed according to the present invention can be thin layers of about 10 μm, since the optical path lengths of incident light thereof are long because of the possession of the uneven shape.

(Embodiment 2)

Embodiment 2 is an embodiment of production of the solar cell, and the substrate having been used once in the steps is reclaimed by anisotropic etching in order to put it into further steps. FIGS. 15A to 18E are the cross-sectional views for illustrating the production steps of Embodiment 2.

Figure 15A:
FIGS. 15A, 15B, 15C, 15D and 15E are cross-sectional views for illustrating production steps of the solar cell of Embodiment 2.
Figure 15B:
Figure 15C:
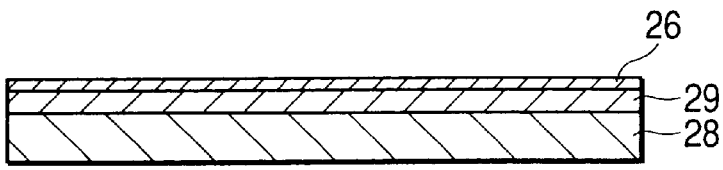
Figure 15D:
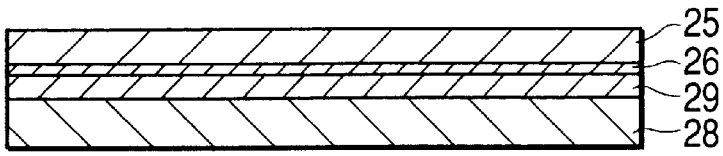
Figure 15E:
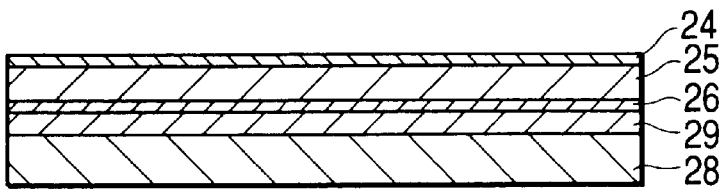
Figure 16A:
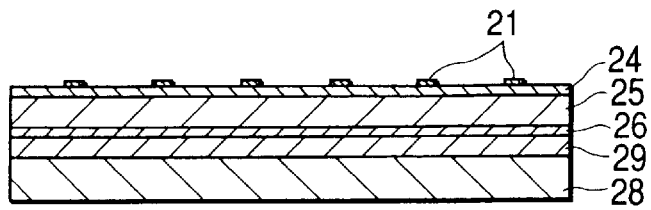
FIGS. 16A, 16B, 16C, 16D, 16E and 16F are cross-sectional views for illustrating production steps of the solar cell of Embodiment 2.

First, the Si wafer 3 is prepared as illustrated in FIG. 15A and the surface of this Si wafer 3 is subjected to anodization. At this time, the anodization method employed herein is the same as the method described in Embodiment 1 with reference to FIGS. 4A and 4B. The Si wafer 3 is an ordinary Si wafer having an even surface. This anodization step results in obtaining the non-porous Si substrate 28 with the porous Si layer 29 in the surface of the substrate as illustrated in FIG. 15B. Then, the $p^+$ Si layer 26 is epitaxially grown to the thickness of 0.1 to 2 μm on the porous Si layer 29 as illustrated in FIG. 15C, and the $p^-$ Si layer 25 is epitaxially grown to the thickness of 20 to 50 μm on the $p^+$ Si layer 26 as illustrated in FIG. 15D. Further, the $n^+$ Si layer 24 is epitaxially grown to the thickness of 0.1 to 20 μm on the $p^-$ Si layer 26 as illustrated in FIG. 15E and the grid electrode 21 is formed on the surface of the $n^+$ Si layer 24 as illustrated in FIG. 16A.

Figure 16B:
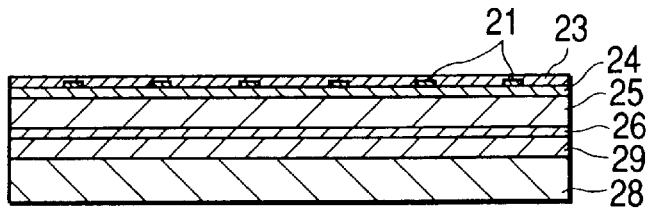
Figure 16C:
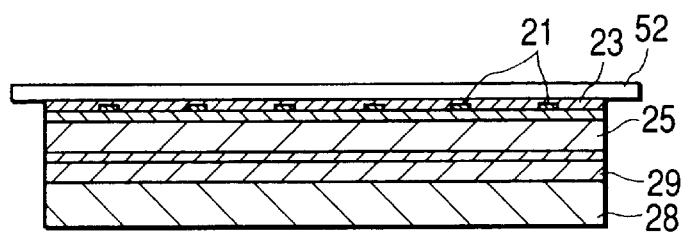
Figure 16D:
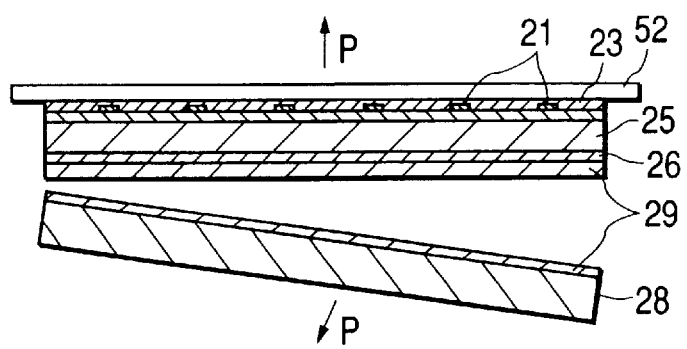
Figure 16E:
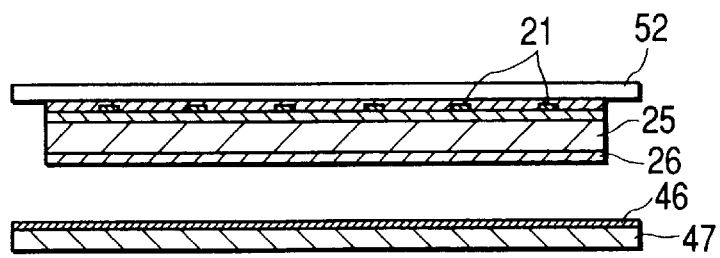
Figure 16F:
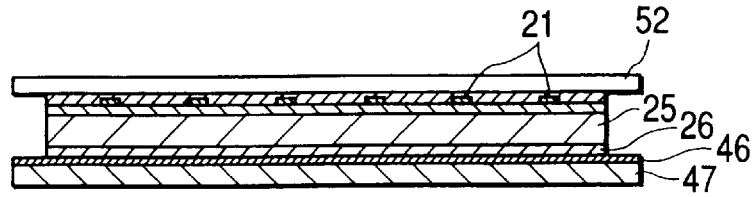

Next, the antireflection film 23 is formed on the grid electrode 21 and to $n^+$ Si layer 24 as illustrated in FIG. 16B, and a tape 52 is glued onto the antireflection film 23 as illustrated in FIG. 16C. Then the tensile force is exerted between the tape 52 and the non-porous Si substrate 28 as illustrated in FIG. 16D, whereby the non-porous Si substrate 28 is separated from the epitaxial Si layers 24, 25 and 26 at the porous Si layer 29. After that, the residue of the porous Si layer 29 remaining on the back surface of the $p^+$ Si layer 26 is removed by a method of polishing, etching, or the like, as illustrated in FIG. 16E, and then the back surface of the $p^+$ Si layer 26 is bonded to a support substrate 47 having a back electrode 46 with an electroconductive adhesive or the like, as illustrated in FIG. 16F.

As a result, the single-crystal Si solar cell is produced from the Si wafer. This solar cell does not have the uneven shape, but solar cells after this process are those having the uneven surface in the photoelectric conversion layers. The production method thereof will be described below.

Figure 17A:
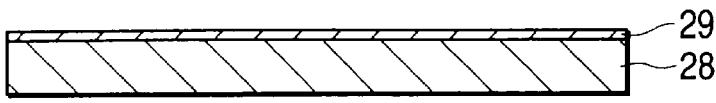
FIGS. 17A, 17B, 17C, 17D, 17E, 17F and 17G are cross-sectional views for illustrating production steps of the solar cell of Embodiment 2.
Figure 17B:
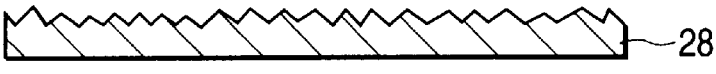

The non-porous Si substrate 28 with the residue of the porous Si layer 29 on the surface formed by separation in FIG. 16D is present as illustrated in FIG. 17A. The surface of this non-porous Si substrate 28 is textured with the alkali etching liquid such as KOH or the like, as illustrated in FIG. 17B, while the residue of the porous Si layer 29 is removed simultaneously. At this time, it is desirable to cover the back surface of the non-porous Si substrate 28 with an oxide film or a nitride film so as to prevent the back surface of the non-porous Si substrate 28 from being etched.

Figure 17C:
Figure 17D:
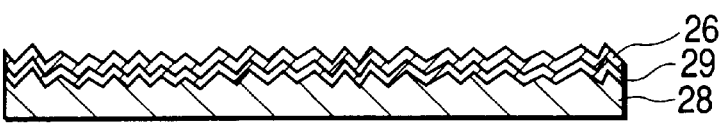

Then the textured non-porous Si substrate 28 of FIG. 17B is used by the anodization apparatus as illustrated in FIG. 4A or 4B to form the porous Si layer 29 again on the textured surface of the non-porous Si substrate 28 as illustrated in FIG. 17C. Then the $p^+$ Si layer 26 is epitaxially grown to the thickness of 0.1 to 2 μm on the porous Si layer 29 as illustrated in FIG. 17D.

Figure 17E:
Figure 17F:
Figure 17G:
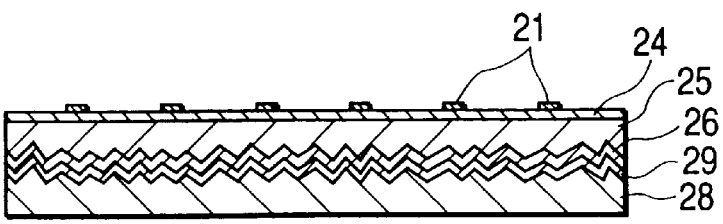

Next, the $p^-$ Si layer 25 is epitaxially grown to the thickness of 20 to 50 μm on the $p^+$ Si layer 26 as illustrated in FIG. 17E. At this time, since the $p^-$ Si layer 25 is grown as the thick film 20 to 50 μm thick, the grown surface tends to become flat. Then the $n^+$ Si layer 24 is epitaxially grown to the thickness of 0.1 to 20 μm on the $p^-$ Si layer 25 as illustrated in FIG. 17F and the grid electrode 21 is formed on the surface of the $n^+$ Si layer 24 as illustrated in FIG. 17G.

Figure 18A:
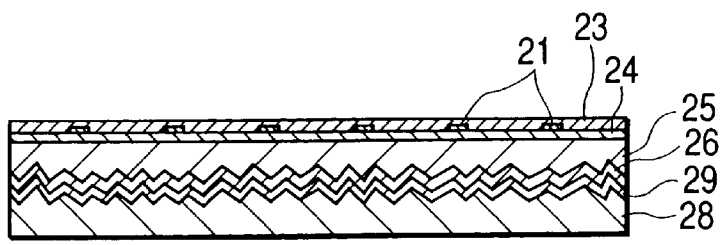
FIGS. 18A, 18B, 18C, 18D and 18E are cross-sectional views for illustrating production steps of the solar cell of Embodiment 2.
Figure 18B:
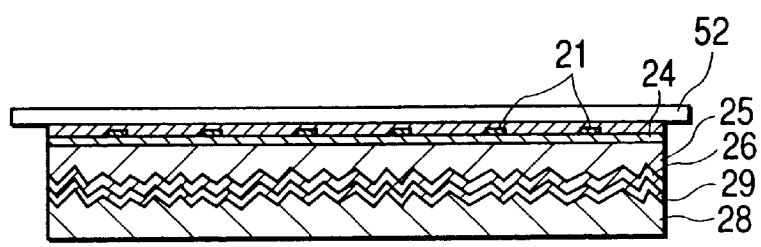
Figure 18C:
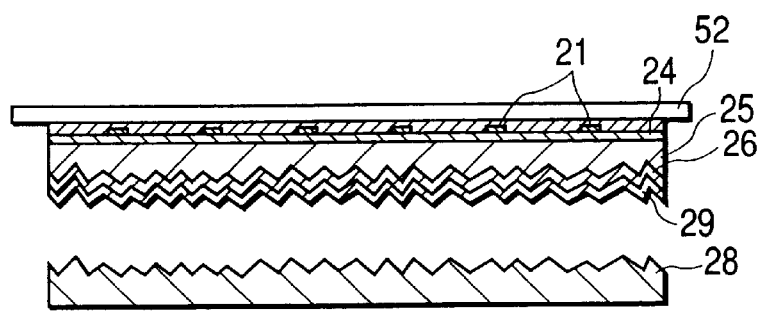
Figure 18D:
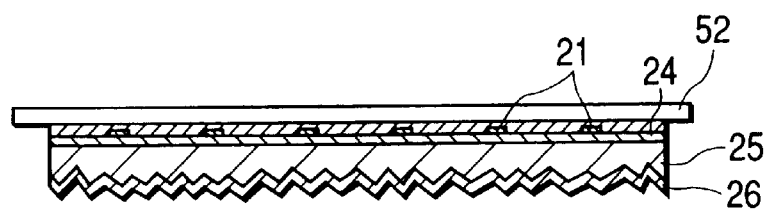
Figure 18E:
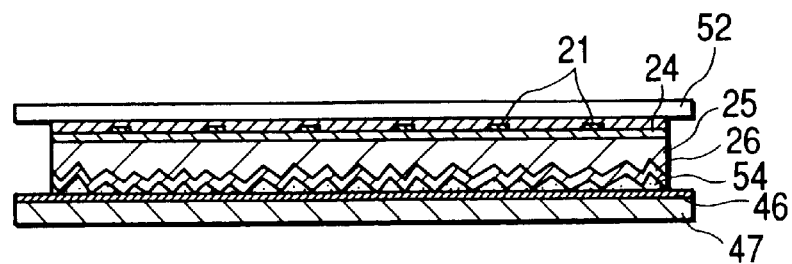
Figure 19:
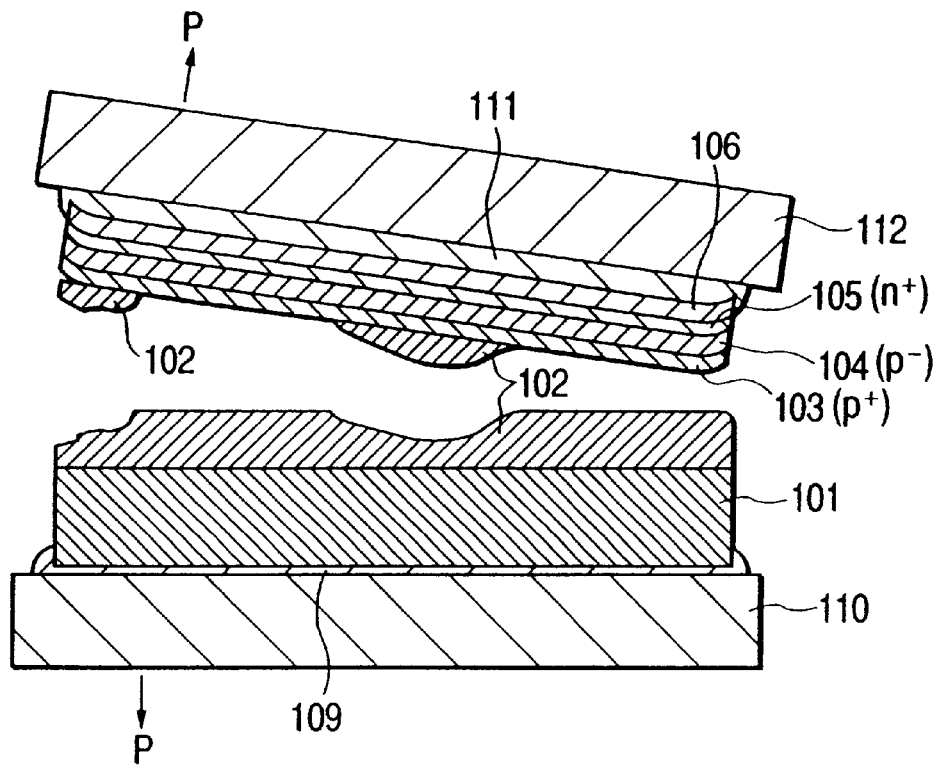
FIG. 19 is a cross-sectional view for illustrating a conventional solar cell production step.
Figure 20:
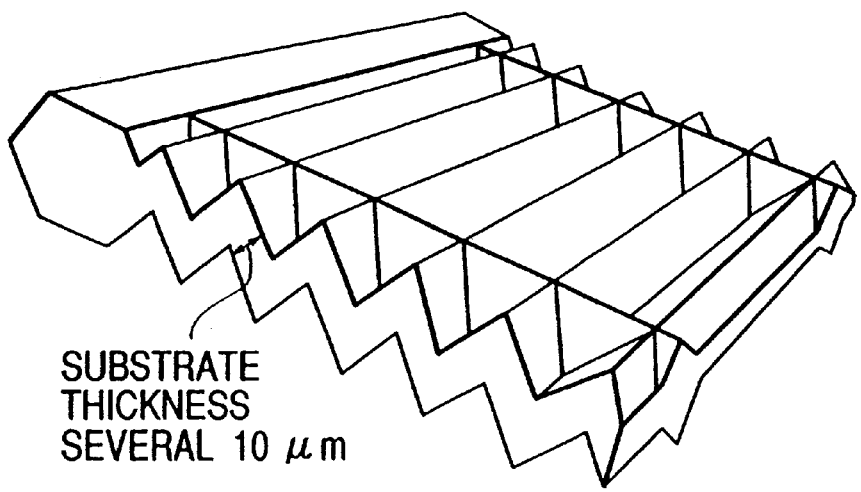
FIG. 20 is a cross-sectional view of a conventional corrugated substrate.

Next, the antireflection film 23 is formed on the grid electrode 21 and the $n^+$ Si layer 24 as illustrated in FIG. 18A, and the tape 52 is glued onto the antireflection film 23 as illustrated in FIG. 18B. Then the tensile force is applied between the tape 52 and the non-porous Si substrate 28 as illustrated in FIG. 18C, whereby the non-porous Si substrate 28 is separated from the epitaxial Si layers 24, 25 and 26 at the porous Si layer 29. After that, the residue of the porous Si layer 29 remaining on the back surface of the $p^+$ Si layer 26 is removed by the method of polishing, etching, or the like, as illustrated in FIG. 18D. At this time, there is no problem even if some residue of the porous Si layer 29 remains in the bottom portions of the texture shape. After that, the back electrode 46 is formed by evaporation of Al on the textured portion on the back surface of the $p^+$ Si layer 26, and the support substrate 47 is glued thereto with the electroconductive adhesive or the like, as illustrated in FIG. 18E. At this time, it is optional to fill the space between the back electrode 46 and the support substrate 47 with a packing material 54.

In the solar cell formed in this way, the front surface as the light incident surface is substantially flat, while the back surface of the photoelectric conversion layer and the back electrode are of the textured structure. Since in this solar cell the light not captured by the photoelectric conversion layer on the occasion of direct incidence is scattered at the textured back electrode to be guided back to the photoelectric conversion layer, the reflected light travels through longer paths in the photoelectric conversion layer and is thus likely to be absorbed. The flatness of the front surface facilitates precise alignment of the grid and also allows uniform coating of the antireflection film, whereby the single-crystal thin-film solar cell with high light absorption efficiency can be produced at a low production cost.

The non-porous Si substrate 28 separated in the step of FIG. 18C having the residue of the porous Si layer 29 is immersed in a selective etching liquid for the porous Si layer 29, such as a mixed solution of hydrofluoric acid and hydrogen peroxide, to remove the porous Si layer 29, and the resultant substrate can also be used again as the substrate of FIG. 17B. The alkali anisotropic etching liquid such as KOH or the like may also be used in order to remove the residue of the porous Si layer 29. The use of the anisotropic etching liquid permits simultaneous achievement of the removal of the residue of the porous Si layer 29 and the texturing for further sharpening the non-porous Si substrate 28.

(Embodiment 3)

Embodiment 3 is the embodiment in which the solar cell is produced by using the porous Si layer as the separation layer, growing two single-crystal Si layers thereon, and defining the separation surface as a light incident layer. FIGS. 6A to 6E and FIGS. 7A to 7D are the cross-sectional views for showing the production steps of the solar cell of Embodiment 3.

Figure 6A:
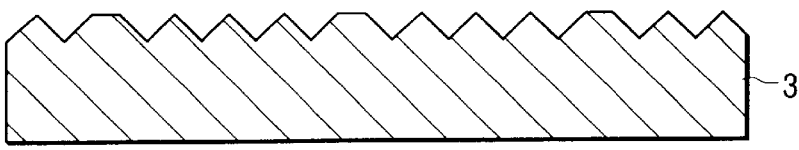
FIGS. 6A, 6B, 6C, 6D and 6E are cross-sectional views for illustrating production steps of the solar cell of Embodiment 3.
Figure 6B:
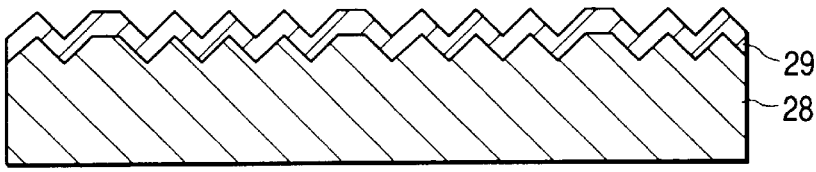

First, using the Si wafer 3 illustrated in FIG. 5B, which was reclaimed in Embodiment 1, the porous Si layer 29 as the separation layer is formed by anodization, as illustrated in FIG. 6B.

Figure 6C:
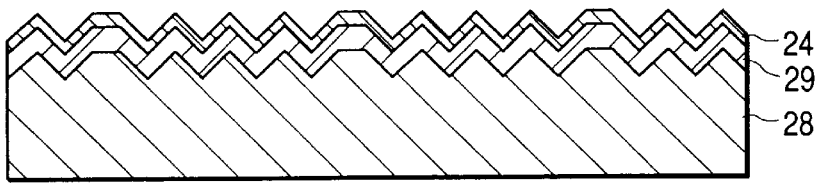
Figure 6D:
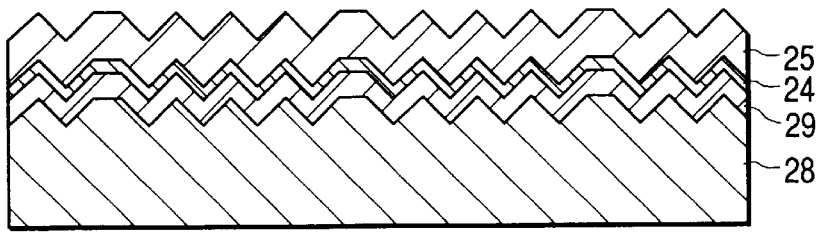

Then, as illustrated in FIG. 6C, the single-crystal $n^+$ Si layer 24 is epitaxially grown on the porous Si layer 29. Then the single-crystal $p^-$ Si layer 25 is formed as illustrated in FIG. 6D.

Figure 6E:
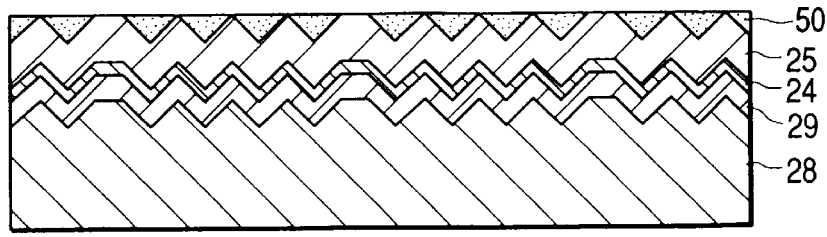
Figure 7A:
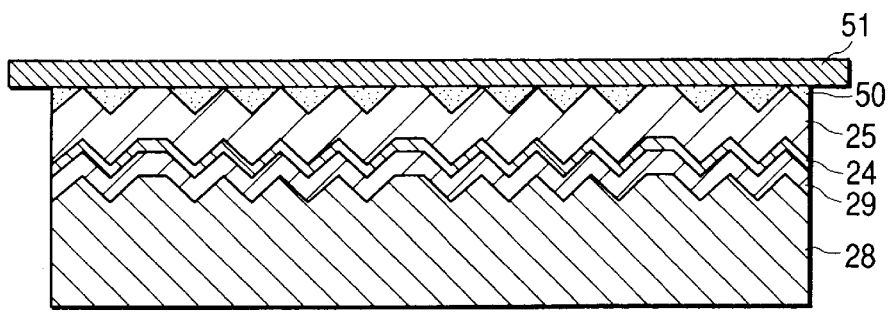
FIGS. 7A, 7B, 7C and 7D are cross-sectional views for illustrating production steps of the solar cell of Embodiment 3.

Then the adhesive 50 is applied as illustrated in FIG. 6E and an underlying substrate 51 with an Al sheet glued thereto is bonded so as to establish electrical connection to the p⁻ Si layer 25 as illustrated in FIG. 7A. In this case, since the back reflecting layer is the Al sheet, the Al sheet is desirably one having high reflectance. After that, it is baked to establish the ohmic contact between the underlying substrate 51 with the Al sheet and the p⁻ Si layer 25.

Figure 7B:
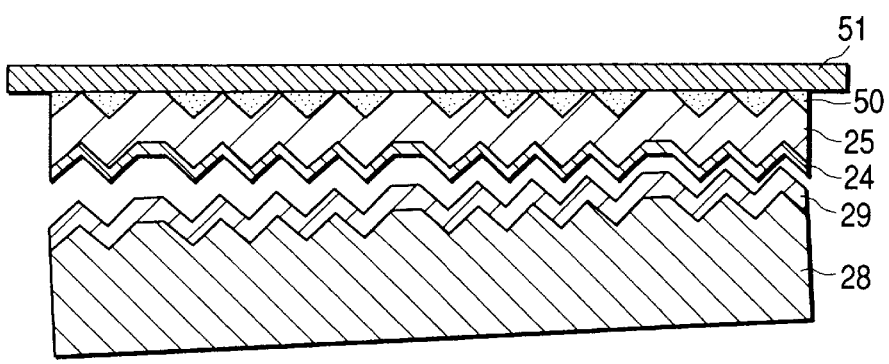
Figure 7C:
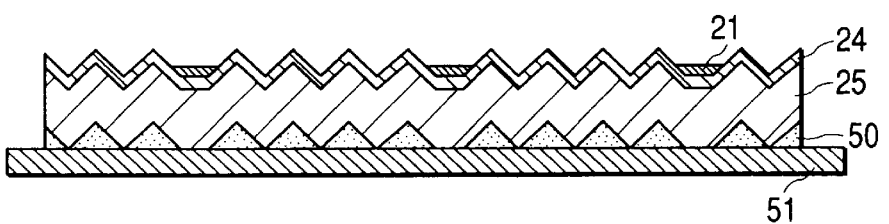
Figure 7D:
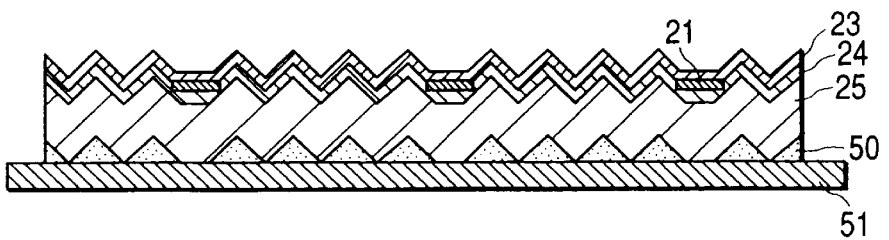

Then the tensile force is applied between the underlying substrate 51 and the non-porous Si substrate 28 to separate the non-porous Si substrate 28 from the single-crystal Si layers 24 and 25 at the porous Si layer, as illustrated in FIG. 7B. Then the grid electrode 21 is laid on the flat portions of the n⁺ Si layer 24 having the uneven shape by the method of printing or the like and the surface is covered by the antireflection film 23, thereby completing a solar cell unit.

According to Embodiment 3, the production cost can be reduced, because the epitaxially grown layers are only the two layers, i.e., the n⁺ Si layer 24 and the p⁻ Si layer 25.

(Embodiment 4)

Embodiment 4 is the embodiment in which the solar cell is produced by using the porous Si layer as the separation layer, growing two layers of semiconductor thin films thereon, and defining the back surface as the separation surface. FIGS. 8A to 8E and FIGS. 9A to 9D are the cross-sectional views for illustrating the production steps of the solar cell of Embodiment 4.

Figure 8A:
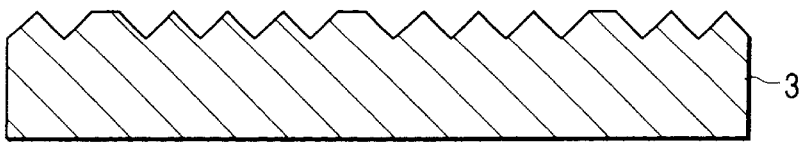
FIGS. 8A, 8B, 8C, 8D and 8E are cross-sectional views for illustrating production steps of the solar cell of Embodiment 4.
Figure 8B:
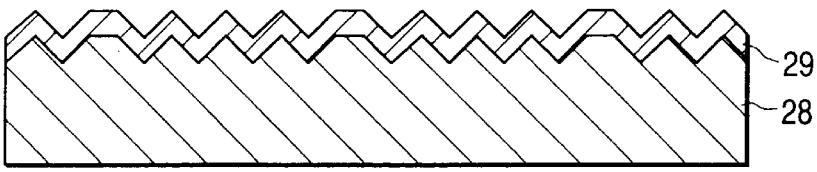

Using the Si wafer 3 illustrated in FIG. 5B, which was reclaimed in Embodiment 1, the porous Si layer 29 as the separation layer is formed by anodization, as illustrated in FIG. 8B.

Figure 8C:
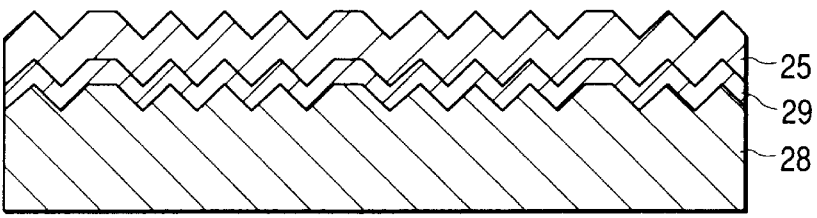
Figure 8D:
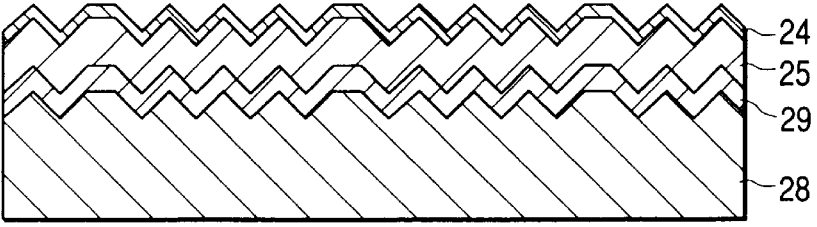

As illustrated in FIG. 8C, the single-crystal p⁻ Si layer 25 is epitaxially grown on the porous Si layer 29. As illustrated in FIG. 8D, the single-crystal n⁺ Si layer 24 is formed thereon.

Figure 8E:
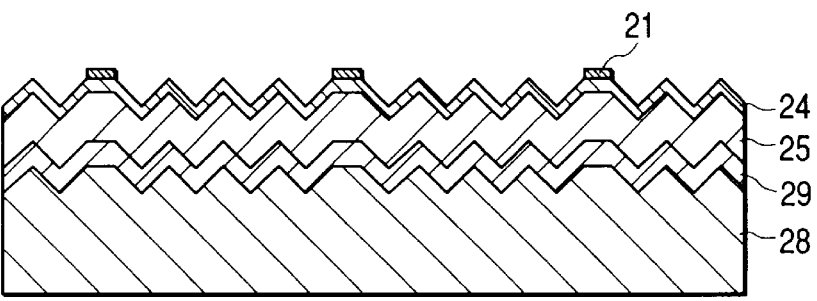
Figure 9A:
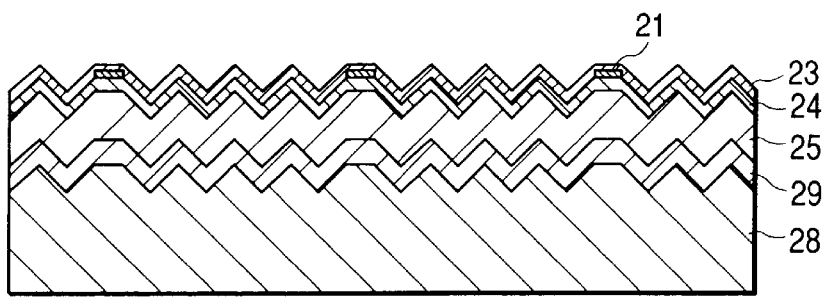
FIGS. 9A, 9B, 9C and 9D are cross-sectional views for illustrating production steps of the solar cell of Embodiment 4.
Figure 9B:
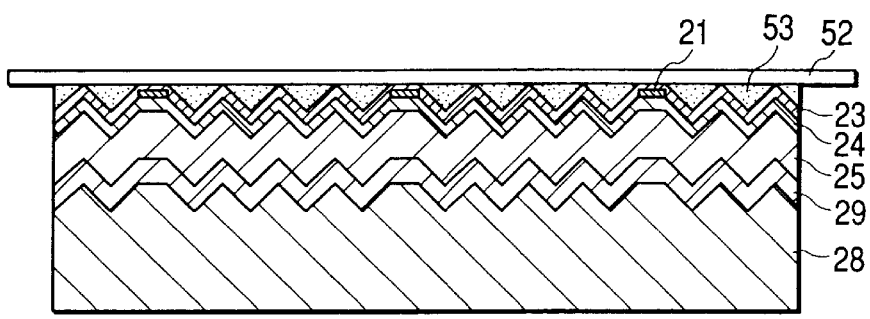
Figure 9C:
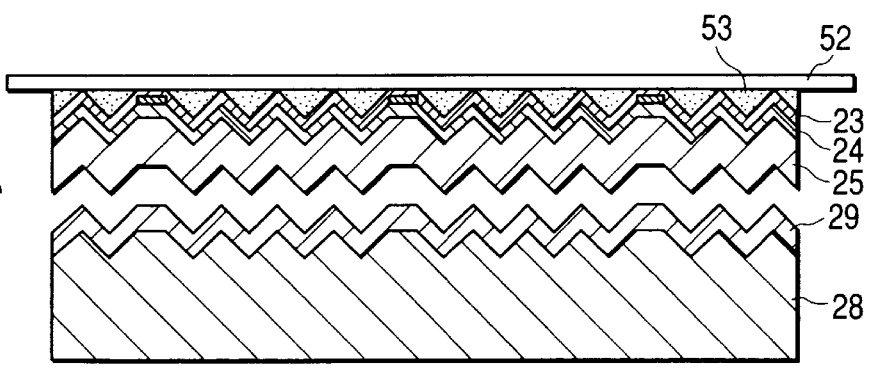

Then the grid electrode 21 is formed on the n⁺ Si layer 24 having the uneven shape, as illustrated in FIG. 8E. The n antireflection film 23 is laid as illustrated in FIG. 9A and the tape 52 is glued with the adhesive 53, as illustrated in FIG. 9B. Then the non-porous Si substrate 28 is separated from the single-crystal Si layers 24 and 25 at the porous Si layer 29, as illustrated in FIG. 9C, by applying a tensile force between the tape 52 and the non-porous Si substrate 28, or by ejecting the water jet between the tape 52 and the non-porous Si substrate 28, for example.

Figure 9D:
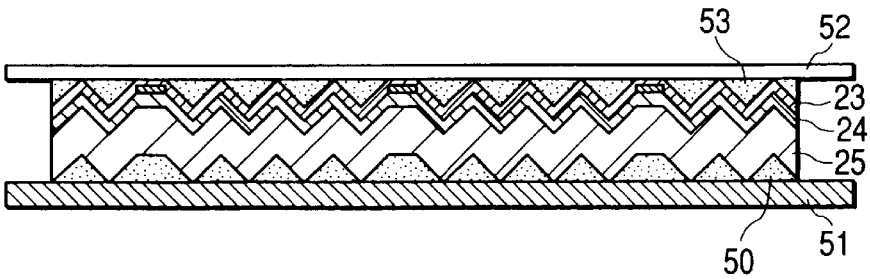

After that, the adhesive 50 is delivered and the underlying substrate 51 with the Al sheet glued thereto is bonded so as to establish the electrical connection to the p⁻ Si layer 25, as illustrated in FIG. 9D. Then the resultant is baked to establish the ohmic contact between the underlying substrate 51 with the Al sheet glued thereto and the p⁻ Si layer 25, thereby accomplishing a solar cell unit. Here the tape 52 and the adhesive 50 may be removed as occasion demands. It is also permissible to change the order of the steps as long as it is possible.

According to Embodiment 4, the production cost can be reduced, because the epitaxially grown layers are only the two layers, i.e., the n⁺ Si layer 24 and the p⁻ Si layer 25.

(Embodiment 5)

Embodiment 5 is the embodiment in which the solar cell is produced by using the porous Si layer as the separation layer, growing two single-crystal Si layers thereon, and separating the substrate by use of through holes bored in the single-crystal Si layers. FIGS. 10A to 10E, FIGS. 11A to 11D, and FIGS. 12A to 12D are the cross-sectional views for illustrating the production steps of the solar cell of Embodiment 5.

Figure 10A:
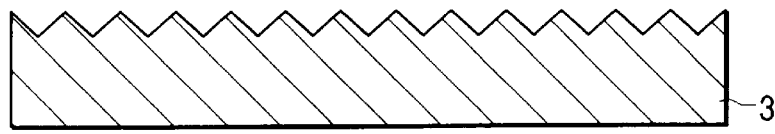
FIGS. 10A, 10B, 10C, 10D and 10E are cross-sectional views for illustrating production steps of the solar cell of Embodiment 5.
Figure 10B:
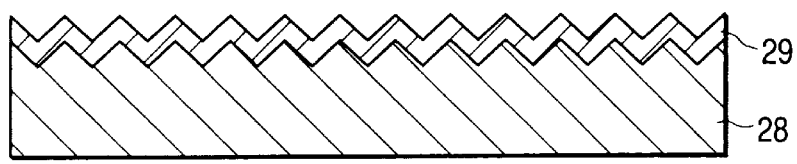

Using the Si wafer 3 illustrated in FIG. 17B, which was reclaimed in Embodiment 2, the Si wafer 3 is subjected to anodization in a manner similar to that in Embodiment 1, to form the porous Si layer 29 in the surface, as illustrated in FIG. 10B.

Figure 10C:
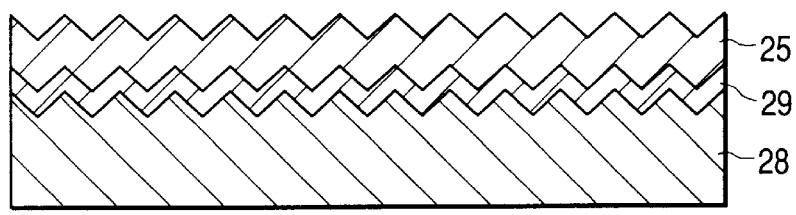
Figure 10D:
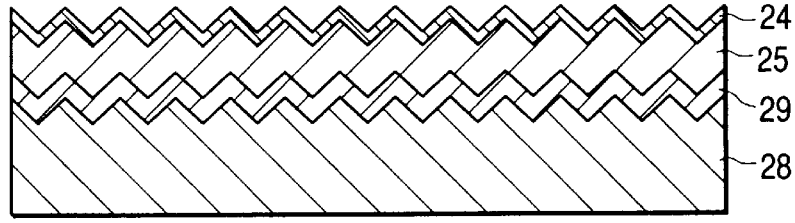
Figure 10E:
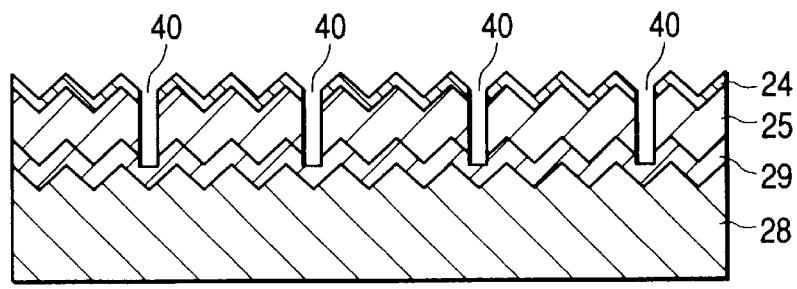

Then the p⁻ Si layer 25 is epitaxially grown on the porous Si layer 29 as illustrated in FIG. 10C and the n⁺ Si layer 24 is formed as illustrated in FIG. 10D. Then through holes 40 from the surface of the n⁺ Si layer 24 into the porous Si layer 29 are bored by a technique of laser ablation or the like, as illustrated in FIG. 10E.

Figure 11A:
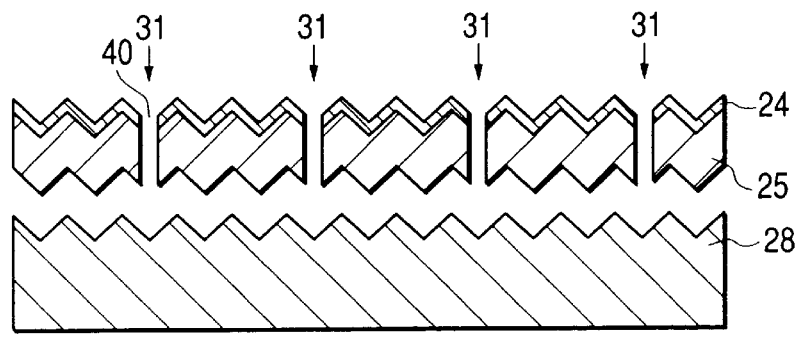
FIGS. 11A, 11B, 11C and 11D are cross-sectional views for illustrating production steps of the solar cell of Embodiment 5.
Figure 11B:
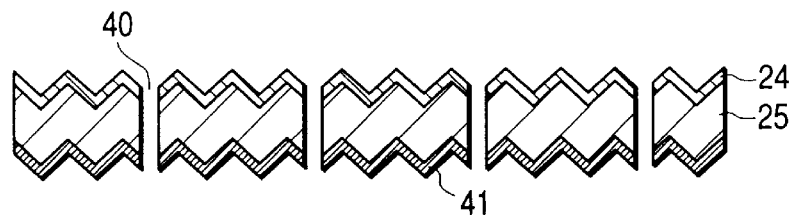
Figure 11C:
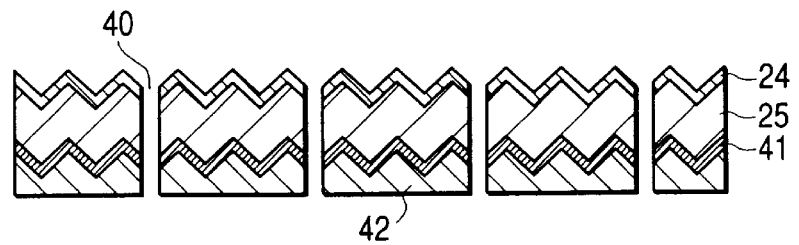
Figure 11D:
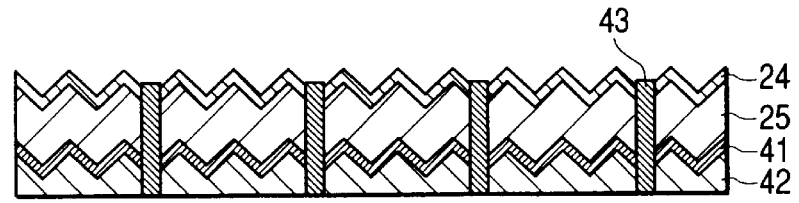

Then the porous Si layer 29 is selectively etched by permeating the HF-based etching liquid 31 such as the mixed solution of hydrofluoric acid and hydrogen peroxide, which is a selective etching solution for the porous Si layer 29, through the through holes 40 to the porous Si layer 29, as illustrated in FIG. 11A. This results in separating the non-porous Si substrate 28 from the single-crystal Si layers 24 and 25. Then a perforated Al electrode 41 is aligned and glued to the back surface of the p⁻ Si layer 25, as illustrated in FIG. 11B, and it is then baked to establish the ohmic contact between the p⁻ Si layer 25 and the Al electrode 41. At this time, it is also permissible to employ a method of gluing a non-perforated Al electrode 41 and then boring the holes of the Al electrode 41 again by laser ablation or the like. After that, a perforated insulating sheet 42 is also bonded while being aligned with the through holes 40. It is also permissible at this time to employ a method of first bonding a non-perforated insulating sheet 42 and then boring the holes of the insulating sheet 42 again by laser ablation or the like. Then the through holes 40 are filled with an insulator to form insulating regions 43 by a method of dotting or the like, as illustrated in FIG. 11D.

Figure 12A:
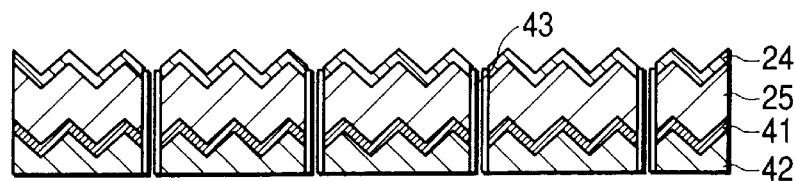
FIGS. 12A, 12B, 12C and 12D are cross-sectional views for illustrating production steps of the solar cell of Embodiment 5.
Figure 12B:
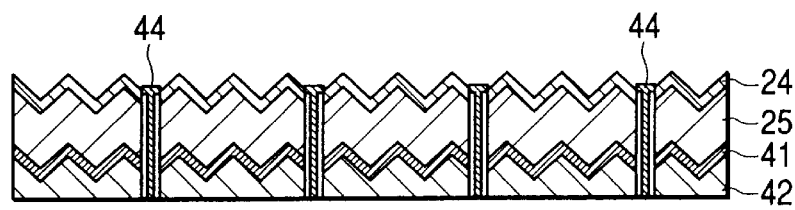
Figure 12C:
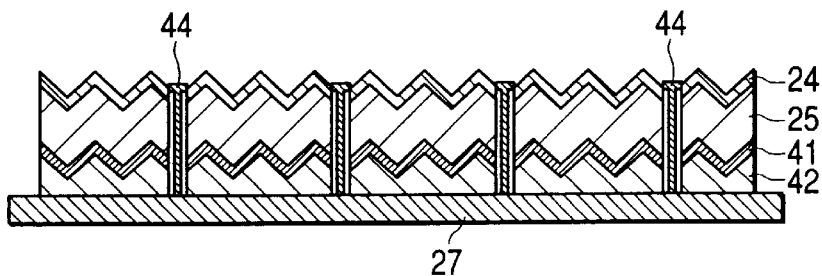
Figure 12D:
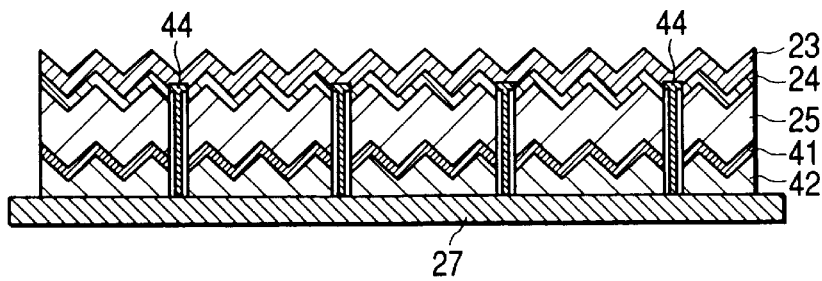

Next, holes are bored through the centers of the insulating regions 43 from the front surface to the back surface again by use of the method of laser ablation or the like, as illustrated in FIG. 12A. Then through hole electrodes 44 are formed, as illustrated in FIG. 12B, by dotting a C (carbon) paste or an Ag (silver) paste into the holes. Then the SUS substrate 27 is bonded to the back surface of the insulating sheet 42 to establish the electrical connection between the through hole electrodes 44 and the SUS substrate 27, as illustrated in FIG. 12C. Then the antireflection film 23 is laid on the surface of the n⁺ Si layer 24, as illustrated in FIG. 12D, thereby accomplishing a solar cell of unit.

In the solar cell of Embodiment 5, because electrons coming up to the surface are collected by the through holes, there is no need for provision of the grid electrode and thus shadow loss can be reduced considerably. Therefore, the solar cell can be produced in high efficiency. Since the etching using the through holes is carried out for the separation of the single-crystal Si layers in the production of solar cell, the production efficiency is good and the production cost can also be reduced.

(Embodiment 6)

Embodiment 6 is the embodiment in which the solar cell is produced by using a compound semiconductor of different mixed crystal ratios for the separation layer, growing three layers of single-crystal compound semiconductor layers as the semiconductor thin film, and defining the separation surface as a light incident surface. FIGS. 10A to 10E, 11A to 11D, and 12A to 12D used for explanation of Embodiment 5 are used again in place of the figures of the production steps in the present embodiment.

In the case of Embodiment 6, reference numeral 28 denotes a GaAs wafer, 29 a GaAlAs layer, 24 an n⁺ GaAs layer, and 25 a p⁻ GaAs layer. The GaAs wafer 28 is separated from the single-crystal GaAs layers 24 and 25 by using an etching liquid that selectively etches the GaAsAl layer 29, such as hydrofluoric acid (HF) or the like. The steps except for the above are the same as in Embodiment 5.

According to Embodiment 6, the solar cell can be produced with a high photoelectric conversion efficiency, because GaAs with a high conversion efficiency is used for the materials. It is also optional to employ a technique of enhancing the conversion efficiency, for example, by forming the single-crystal GaAs layers 24 and 25 in the quantum well structure. Just as in Embodiment 5, it is also possible to obtain the semiconductor thin films of GaAs by using the Si wafer as the substrate, using the porous Si layer as the separation layer, epitaxially growing the single-crystal GaAs layers on the porous Si layer, and effecting the selective etching of the porous Si layer.

(Embodiment 7)

Embodiment 7 is the embodiment of production of the photosensor according to the present invention. FIGS. 13A to 13D and FIG. 14A are the cross-sectional views for illustrating the production steps of the photosensor, and FIG. 14B-1 and FIG. 14B-2 are plan views for showing the front surface and from the back surface of the photosensor completed, respectively.

First, thin-film single-crystal Si layers are formed by stacking the p⁻ Si layer 25 and n⁺ Si layer 24 in the same steps as in FIGS. 10A to 10E of Embodiment 5. In the method of Embodiment 7, the etching liquid is allowed to permeate through the through holes 40, in the same manner as in Embodiment 5, to etch the porous Si layer, thereby obtaining the semiconductor thin film. For forming the through holes 40, a plurality of holes penetrating the p⁻ Si layer 25 and the n⁺ Si layer 24 are bored by a laser or the like. Scribe lines 45 for insulation isolation of rows or lines of an area sensor are also made in the same step as the formation step of the through holes 40. Then the selective etching of the porous Si layer 29 is effected by the same step as the step described referring to FIG. 11A of Embodiment 5, to separate the non-porous Si substrate 28 from the epitaxial Si layers 24 and 25.

Figure 13A:
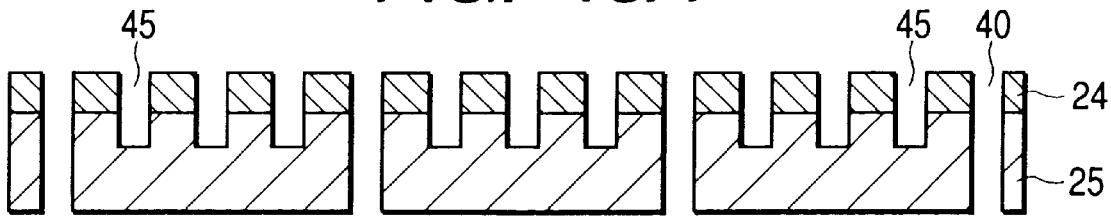
FIGS. 13A, 13B, 13C and 13D are cross-sectional views for illustrating production steps of the photosensor of Embodiment 7.

As a consequence, the epitaxial Si layers 24 and 25 are obtained as illustrated in the cross-sectional view of FIG. 13A. In the cross-sectional view of FIG. 13A, the uneven structure is not illustrated in the front and back surfaces of the epitaxial Si layers 24 and 25 as the semiconductor thin film, but they actually have the fine uneven shape.

Figure 13B:
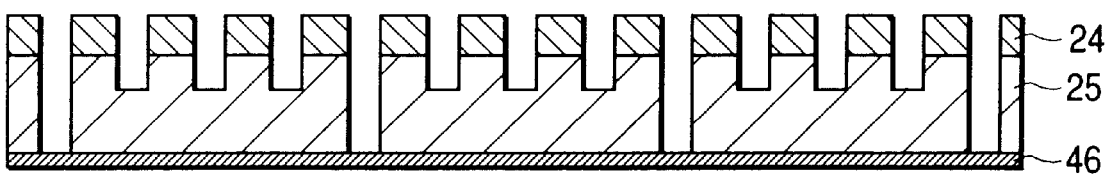
Figure 13C:
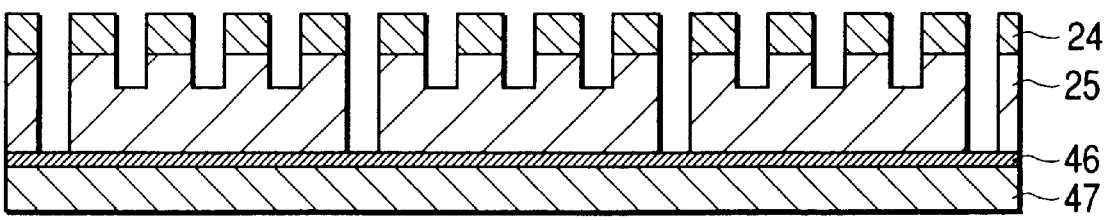
Figure 13D:
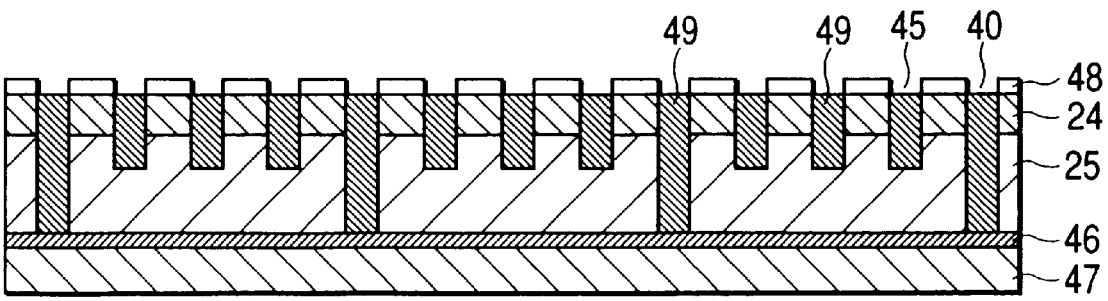

Then back electrodes 46 running in a stripe pattern in the direction normal to the scribe lines 45 are bonded to the back surface of the p⁻ Si layer 25, as illustrated in FIG. 13B. Then the support substrate 47 is bonded thereto as illustrated in FIG. 13C. Next, transparent electrodes 48 are made of a transparent conductive film of ITO or the like on the surface, as illustrated in FIG. 13D. After that, the through holes 40 and scribe lines 45 are filled with an insulator to form the insulating regions 49 as occasion demands.

Figure 14A:
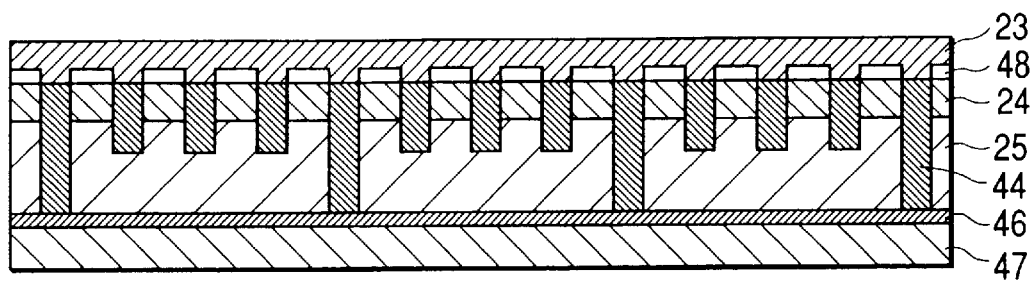
FIG. 14A is a cross-sectional view of the photosensor of Embodiment 7 and FIGS. 14B-1 and 14B-2 are plan views thereof.
Figures 1, 14B:
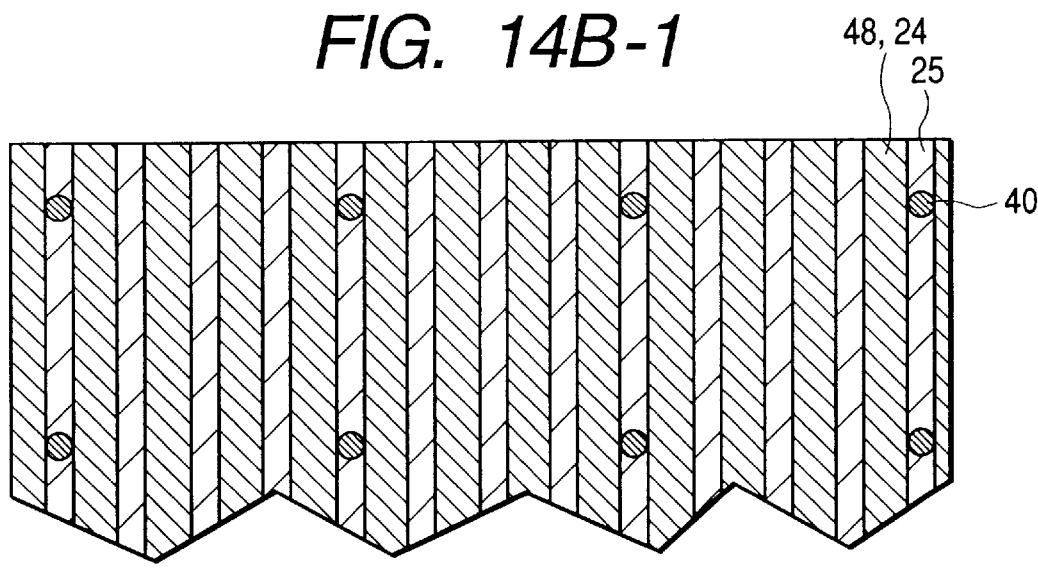
Figures 2, 14B:
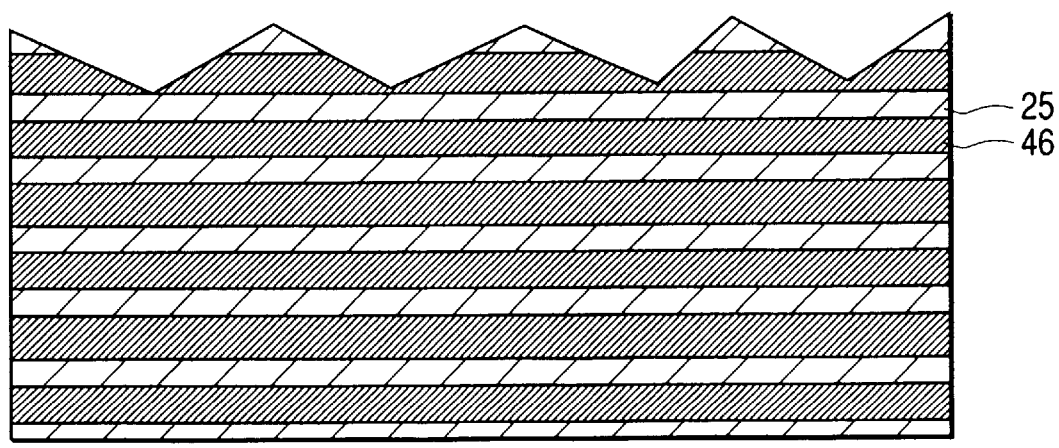

Then the antireflection film 23 is attached to the surface as in the cross-sectional view of FIG. 14A, thereby completing the area sensor. FIG. 14B-1 is a plan view of the area sensor seen from the front surface side and FIG. 14B-2 is a plan view of the area sensor seen from the back surface side. On the front surface the transparent electrodes 48 run in the stripe pattern in the vertical direction, while the back electrodes 46 run in the stripe pattern in the lateral direction. Further, the p⁻ Si layer 25 and the n⁺ Si layer 24 for forming photodiodes are sandwiched between the transparent electrodes 48 and back electrodes 46 forming the simple matrix configuration.

The preferred production methods of the present invention can provide the photoelectric conversion devices provided with the uneven shape while obviating the need for the high-cost steps such as a plurality of photolithography steps or the like. For this reason, the production cost can be reduced for the photoelectric conversion devices with a high conversion efficiency.

The production method of providing the separation layer maintaining the uneven shape of the substrate, on the substrate, forming the semiconductor thin film on the separation layer, and separating the semiconductor thin film from the substrate at the separation layer permits a number of photoelectric conversion devices having the uneven shape on the front and back surfaces to be produced from one substrate. For this reason, the production cost can be reduced greatly for the photoelectric conversion devices with a high conversion efficiency.

The substrate with the separation layer remaining after the separation is subjected to the anisotropic etching in order to form the uneven shape on the semiconductor substrate, whereby the uneven shape can be formed at the same time of reclaim for reuse, by use of the substrate having passed once through the production steps. Therefore, the steps are simplified and the production cost can be reduced for the photoelectric conversion devices.

Since in one embodiment of the photoelectric conversion device of the present invention the front surface is substantially of the flat shape, it facilitates the formation of grid and the formation of the antireflection film on the front surface. The back surface has the uneven shape. Therefore, the photoelectric conversion device with good optical absorption can be provided at a low production cost.

What is claimed is:

1. A method of producing a photoelectric conversion device, comprising:
   (a) preparing a substrate having an uneven shape on a surface thereof;
   (b) providing a separation layer maintaining the uneven shape on the substrate;
   (c) forming a semiconductor film maintaining the uneven shape on the separation layer;
   (d) separating the semiconductor film and the substrate at the separation layer; and
   (e) subjecting the separated substrate to anisotropic etching to form an uneven shape on the surface of the substrate while removing the remaining separation layer in order to use the substrate separated from the semiconductor film as a substrate for use in step (a) at the time of producing another photoelectric conversion device.

2. The production method according to claim 1, wherein the step of providing the separation layer is a step of subjecting a semiconductor substrate to anodization to form a porous semiconductor layer as the separation layer on the semiconductor substrate.

3. A method of producing a photoelectric conversion device, comprising the steps of forming an uneven shape on a surface of a substrate, providing a separation layer maintaining the uneven shape on the substrate, forming a semiconductor film maintaining the uneven shape on the separation layer, and separating the semiconductor film from the substrate at the separation layer,
   wherein the step of forming the uneven shape on the surface of the substrate is a step of forming the substrate having the uneven shape on the surface by anisotropic etching of the substrate with the separation layer remaining after the separation, and
   wherein the step of forming the uneven shape on the surface of the substrate is a step of forming a legion non-parallel to a principal plane of the substrate and a region parallel to the principal plane of the substrate on the surface of the substrate.

4. The production method according to claim 3, wherein anisotropic etching is carried out with a mask provided on a portion of the substrate, whereby the portion provided with the mask on the surface of the substrate is formed as a region parallel to a principal plane of the substrate.

* * * * *

UNITED STATES PATENT AND TRADEMARK OFFICE
CERTIFICATE OF CORRECTION

PATENT NO. : 6,534,336 B1
DATED : March 18, 2003
INVENTOR(S) : Masaakiiwane et al.

It is certified that error appears in the above-identified patent and that said Letters Patent is hereby corrected as shown below:

<u>Column 5,</u>
Line 21, "corrugated," should read -- corrugated --.

<u>Column 7,</u>
Line 10, "J, knobloch, et al.," should read -- J, Knobloch, et al., --; and
Line 12, "J, knobloch, et al.," should read -- J, Knobloch, et al., --.

<u>Column 11,</u>
Line 35, "The n" should read -- Then --.

<u>Column 14,</u>
Line 67, "legion" should read -- region --.

Signed and Sealed this

Seventh Day of October, 2003

JAMES E. ROGAN
*Director of the United States Patent and Trademark Office*